United States Patent
Voo

(10) Patent No.: US 7,359,136 B1
(45) Date of Patent: Apr. 15, 2008

(54) TMR/GMR AMPLIFIER WITH INPUT CURRENT COMPENSATION

(75) Inventor: Thart Fah Voo, Singapore (SG)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 11/652,184

(22) Filed: Jan. 11, 2007

Related U.S. Application Data

(62) Division of application No. 10/929,211, filed on Aug. 30, 2004.

(51) Int. Cl.
*G11B 5/09* (2006.01)
*G11B 5/02* (2006.01)
*H03F 1/36* (2006.01)

(52) U.S. Cl. .............................. 360/67; 360/46; 330/85
(58) Field of Classification Search ...................... None
See application file for complete search history.

(56) References Cited

U.S. PATENT DOCUMENTS

| | | | |
|---|---|---|---|
| 3,918,005 A | 11/1975 | Bruckenstein et al. ........ 330/99 |
| 4,423,387 A * | 12/1983 | Sempel ......................... 330/85 |
| 5,327,303 A * | 7/1994 | Smith .......................... 360/67 |
| 5,377,202 A | 12/1994 | Bryson et al. |
| 6,084,478 A | 7/2000 | Mayampurath ............. 330/308 |
| 6,219,195 B1 | 4/2001 | Jusuf et al. .................... 360/67 |
| 6,420,910 B1 | 7/2002 | Contreras et al. ............. 327/77 |
| 6,538,832 B1 | 3/2003 | Ranmuthu et al. ............ 360/46 |
| 6,741,131 B2 | 5/2004 | Nicklasson ................. 330/254 |
| 7,023,271 B1 | 4/2006 | Aram .......................... 330/99 |
| 2003/0016000 A1 | 1/2003 | Sanchez |
| 2003/0231419 A1 | 12/2003 | Umeyama et al. ............ 360/66 |
| 2004/0264522 A1* | 12/2004 | Panikkath et al. ......... 372/38.1 |

* cited by examiner

*Primary Examiner*—William Korzuch
*Assistant Examiner*—Daniell L. Negrón

(57) ABSTRACT

An amplifier system with feedback current cancellation comprises an amplifier, a feedback network, first and second unity-gain buffers, a second resistance, and a current mirror. The amplifier includes an input, an output, and at least one stage. The feedback network includes a first resistance having one end that communicates with the input of the amplifier and an opposite end that communicates with the output of the amplifier. The first and second buffers each include an input and an output. The inputs of the first and second buffers communicate with the output and the input of the amplifier, respectively. The second resistance communicates with the outputs of the first and second buffers. The current mirror provides a current at the input of the amplifier that is proportional to a second current flowing through the second resistance.

20 Claims, 7 Drawing Sheets

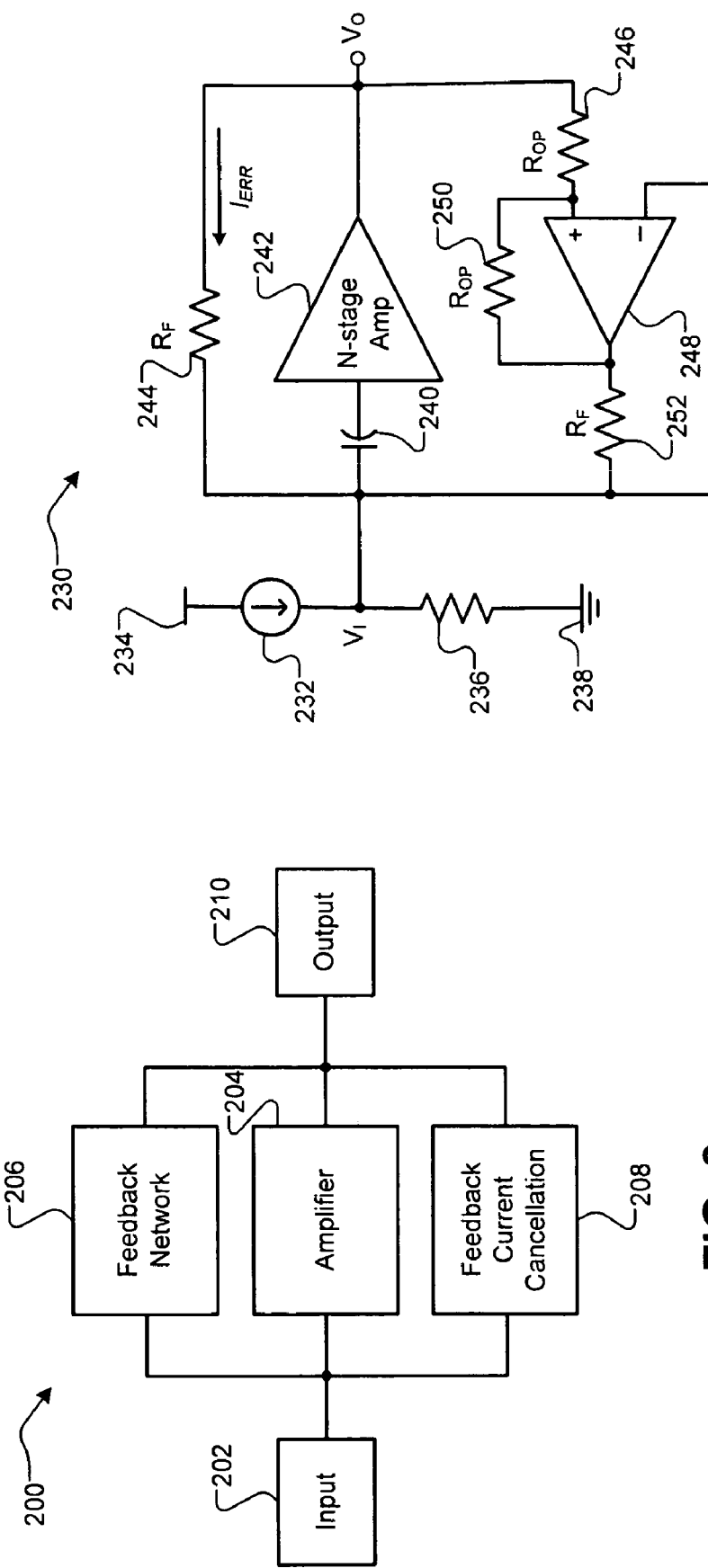

TMR/GMR AMPLIFIER WITH INPUT CURRENT COMPENSATION

CROSS-REFERENCE TO RELATED APPLICATIONS

This application is a divisional of U.S. patent application Ser. No. 10/929,211 filed on Aug. 30, 2004. The disclosure of the above application is incorporated herein by reference.

FIELD OF THE INVENTION

The present invention relates to amplifiers, and more particularly to feedback error current cancellation in a closed-loop amplifier.

BACKGROUND OF THE INVENTION

Referring to FIG. 1, an exemplary magnetic storage system 100 such as a hard disk drive is shown. A buffer 102 stores data that is associated with control of the hard disk drive. The buffer 102 may employ SDRAM or other types of low latency memory. A processor 104 performs processing that is related to the operation of the hard disk drive. A hard disk controller (HDC) 106 communicates with the buffer 102, the processor 104, a host 108 via an I/O channel 110, a spindle/voice coil motor (VCM) driver 112, and a read/write channel circuit 114.

During a write operation, the read/write channel circuit 114 encodes the data to be written onto the storage medium. The read/write channel circuit 114 processes the signal for reliability and may include, for example, error checking and correcting coding (ECC) and run length limited coding (RLL). During read operations, the read/write channel circuit 114 converts an analog output from the medium to a digital signal. The converted signal is then detected and decoded by known techniques to recover the data written on the hard disk drive.

One or more hard drive platters 116 include a magnetic coating that stores magnetic fields. The platters 116 are rotated by a spindle motor that is schematically shown at 118. Generally, the spindle motor 118 rotates the hard drive platters 116 at a fixed speed during read/write operations. One or more read/write arm(s) 120 move relative to the platters 116 to read and/or write data to/from the hard drive platters 116. The spindle/VCM driver 112 controls the spindle motor 118, which rotates the platters 116. The spindle/VCM driver 112 also generates control signals that position the read/write arm 120, for example using a voice coil actuator, a stepper motor, or any other suitable actuator.

A read/write device 122 is located near a distal end of the read/write arm 120. The read/write device 122 includes a write element such as an inductor that generates a magnetic field. The read/write device 122 also includes a read element (such as a magneto-resistive (MR) sensor) that senses the magnetic fields on the platter 116. A preamplifier (preamp) circuit 124 amplifies analog read/write signals. When reading data, the preamp circuit 124 amplifies low level signals from the read element and outputs the amplified signal to the read/write channel circuit 114. While writing data, a write current that flows through the write element of the read/write channel circuit 114 is switched to produce a magnetic field having a positive or negative polarity. The positive or negative polarity is stored by the hard drive platter 116 to represent data.

Referring now to FIG. 2, an exemplary circuit 140 is presented that amplifies a signal across a variable resistance 142. This circuit could be used in the preamplifier of a magnetic storage system where the variable resistance is the MR sensor. A first current source 144 communicates with a supply potential 146. A second current source 148 communicates with a ground potential 150. The first and second current sources 144 and 148 communicate with a first terminal and an opposite terminal of a variable resistance 142, respectively. The first terminal of a variable resistance 142 communicates with a first terminal of a first capacitance 152. The opposite terminal of the variable resistance 142 communicates with a first terminal of a second capacitance 154.

A second terminal of the first capacitance 152 communicates with a noninverting input of a differential operational amplifier (op-amp 156). A second terminal of the second capacitance 154 communicates with an inverting terminal of the op-amp 156. The first terminal of the first capacitance 152 communicates with a first terminal of a first resistance 158. An opposite terminal of the first resistance 158 communicates with a first terminal of a third capacitance 160. A second terminal of the third capacitance 160 communicates with a noninverting output of the op-amp 156. The first terminal of the second capacitance 154 communicates with a first terminal of a second resistance 162. An opposite terminal of the second resistance 162 communicates with a first terminal of a fourth capacitance 164. A second terminal of the fourth capacitance 164 communicates with an inverting output of the op-amp 156.

Traditionally, the third and fourth capacitances 160 and 164 have been included to block DC current from flowing through the first and second resistances 158 and 162, respectively. These error currents would then flow through the variable resistance 142, causing its bias current to differ from what the first and second current sources 144 and 148 establish. Also, the current pulled from the output of the op-amp 156 by the first and second resistances 158 and 162 would affect the op-amp's performance. However, the third and fourth capacitances 160 and 164 create low-pass filters that interact with the high-pass filters created by the first and second capacitances 152 and 154, making the overall frequency response of the circuit difficult to design.

SUMMARY OF THE INVENTION

An amplifier system with feedback current cancellation in some embodiments comprises an amplifier with an input, an output, and at least one stage. A feedback network communicates with the input and output of the amplifier. A feedback current cancellation module provides a first current at the input of the amplifier that substantially cancels a second current provided at the input of the amplifier by the feedback network.

In other features, the feedback current cancellation module is biased by a standby network that operates on standby power when power to the amplifier is turned off. The standby network is a low power circuit that approximately replicates DC characteristics at the input and the output of the amplifier.

In still other features, the feedback current cancellation module provides a third current at the output of the amplifier that substantially cancels a fourth current provided at the output of the amplifier by the feedback network. The feedback current cancellation module is biased by a standby network that operates on standby power when power to the amplifier is turned off. The standby network is a low power circuit that approximately replicates DC characteristics at the input and the output of the amplifier.

A sensor system comprises the amplifier system and further comprises current source and a variable resistance that communicates with, and is biased by, the current source. The input of the amplifier communicates with a terminal of the variable resistance.

A hard disk drive system comprises the sensor system.

In other features, the amplifier is arranged in a differential mode or a single-ended mode. A DC blocking capacitance communicates with the input of the amplifier.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 3 is a block diagram of an exemplary amplifier incorporating a feedback error current cancellation system;

FIG. 4 is an electrical schematic of an exemplary amplifier employing a feedback current cancellation system;

DETAILED DESCRIPTION OF THE PREFERRED EMBODIMENTS

Figure 1:
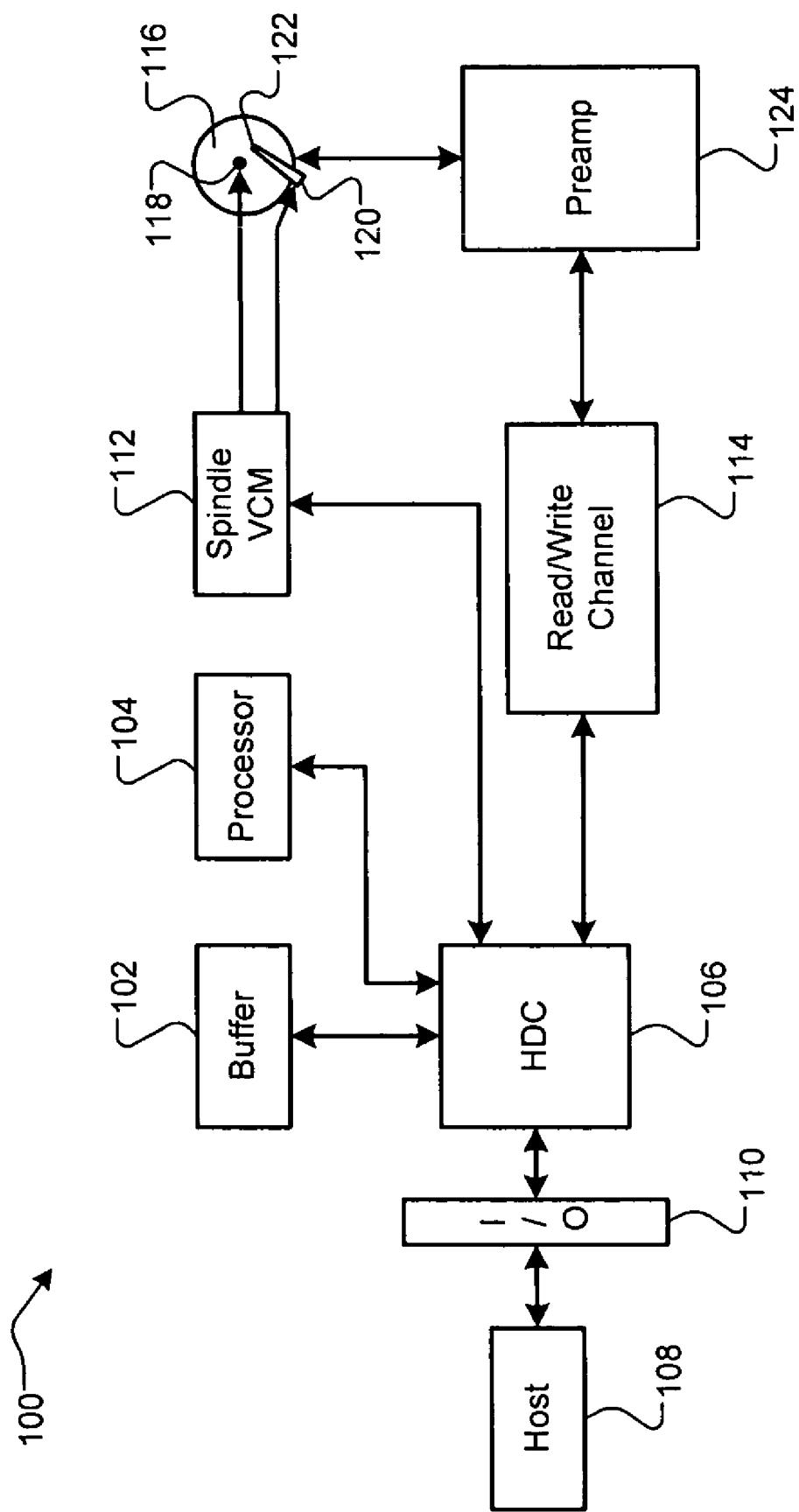
FIG. 1 is an exemplary hard disk drive environment according to the prior art.
Figure 2:
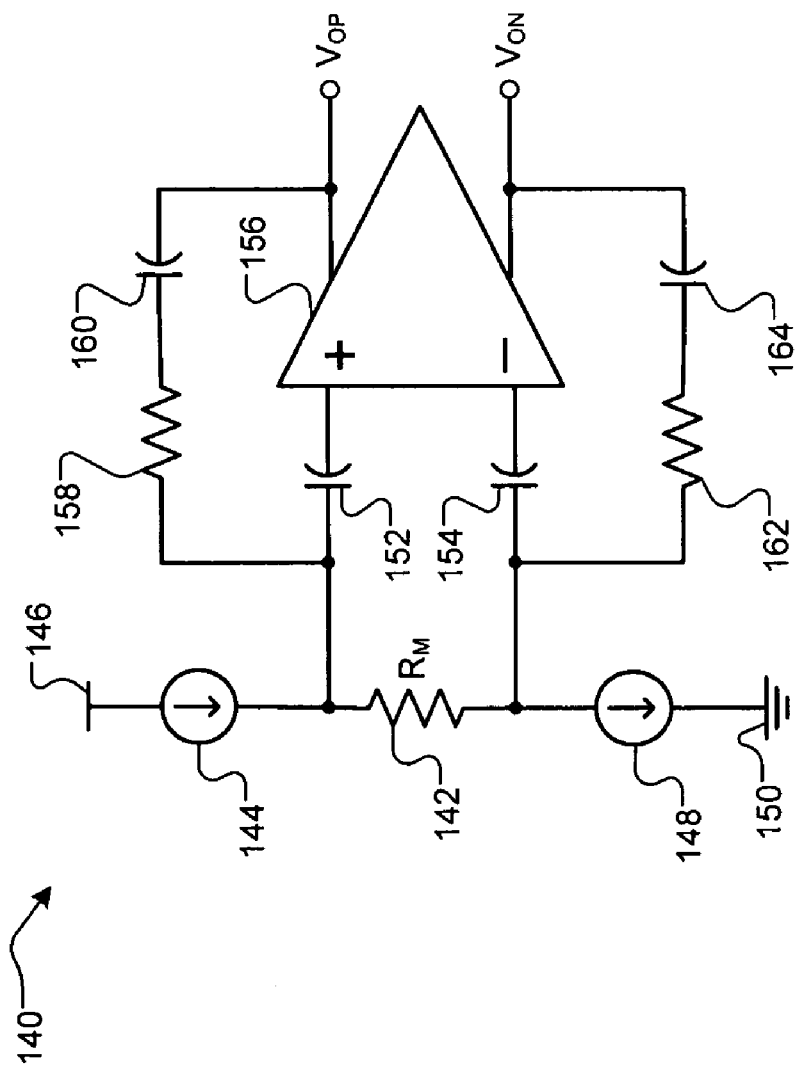
FIG. 2 is an exemplary circuit which amplifies a signal across a variable resistance, according to the prior art.

The following description of the preferred embodiments is merely exemplary in nature and is in no way intended to limit the invention, its application, or uses. For purposes of clarity, the same reference numbers will be used in the drawings to identify similar elements. As used herein, the term module refers to an application specific integrated circuit (ASIC), an electronic circuit, a processor (shared, dedicated, or group) and memory that execute one or more software or firmware programs, a combinational logic circuit, and/or other suitable components that provide the described functionality.

Referring now to FIG. 3, a block diagram of an exemplary amplifier 200 incorporating a feedback error current cancellation system is depicted. An input device 202 communicates a signal to an input of an amplifier 204. The input of the amplifier 204 also communicates with a first terminal of a feedback network 206 and a first terminal of a feedback current cancellation module 208. An output of the amplifier 204 communicates with an output device 210. The output of the amplifier 204 also communicates with a second terminal of the feedback network 206 and a second terminal of the feedback current cancellation module 208. The feedback network 206 draws current $I_{ERR}$ into the second terminal. The feedback network 206 also communicates current equal to $I_{ERR}$ out of the first terminal.

Without the feedback current cancellation module 208, the current $I_{ERR}$ going into the second terminal of the feedback network 206 would be drawn from the output of the amplifier 204. The current leaving the first terminal of the feedback network 206, which is equal to $I_{ERR}$ would flow into the input device 202. The feedback current cancellation module 208 provides current that is opposite to $I_{ERR}$ to the input of the amplifier 204. The current from the first terminal of the feedback current cancellation module 208 and from the first terminal of the feedback network 206 cancel at the input of the amplifier 204. Thus no current passes back into the input device 202. In other words, $I_{ERR}$ flows from the first terminal of the feedback network 206 into the first terminal of the feedback current cancellation module 208. Optionally, the feedback current cancellation module 208 can also provide current $I_{ERR}$ to the output of the amplifier 204. $I_{ERR}$ would then flow from the second terminal of the feedback current cancellation module 208 to the second terminal of the feedback network 206. Therefore, the feedback network 206 would draw no current from the output of the amplifier 204.

Skilled artisans will recognize that the currents referenced in the description of FIG. 3 may be negative as well as positive. For example, if $I_{ERR}$ is negative, the feedback network 206 draws a current into its first terminal and provides a current out of its second terminal. In this case, the feedback cancellation module 208 would provide current at the first terminal of the feedback network 206 such that the current would flow directly from the feedback cancellation module 208 to the feedback network 206 without drawing current from the input device 202.

Referring now to FIG. 4, an exemplary electrical schematic of an amplifier 230 employing a feedback current cancellation system is shown. For purposes of illustration, a single-ended implementation is shown. Skilled artisans will recognize that the same techniques can be applied equally to a differential amplifier. A first current source 232 communicates with a supply potential 234. The first current source 232 also communicates with a first terminal of a variable resistance 236. An opposite terminal of the variable resistance 236 communicates with a ground potential 238. The first terminal of the variable resistance 236 communicates with a first terminal of a first capacitance 240. A second terminal of the first capacitance 240 communicates with an input of a single-ended amplifier 242.

Skilled artisans will recognize that the single-ended amplifier 242 may include multiple stages. An output of the single-ended amplifier 242 communicates with a first terminal of a first resistance 244. An opposite terminal of the first resistance 244 communicates with the first terminal of the first capacitance 240. The output of the single-ended amplifier 242 communicates with a first terminal of a second resistance 246. An opposite terminal of the second resistance 246 communicates with a noninverting input of an operational amplifier (op-amp) 248. The noninverting input of the op-amp 248 communicates with a first terminal of a third resistance 250. An opposite terminal of the third resistance 250 communicates with an output of the op-amp 248. A first terminal of a fourth resistance 252 communicates with the output of the op-amp 248. An opposite terminal of the fourth resistance communicates with an inverting input of the op-amp. The opposite terminal of the fourth resistance 252 also communicates with the first terminal of the first capacitance 240.

The voltage at the output of the single-ended amplifier 242 will be referred to as $V_O$. The voltage at the first terminal of the variable resistance 236 will be referred to as $V_I$. In one embodiment, the first and fourth resistances 244 and 252 are both equal to the value $R_F$, and the second and third resistances 246 and 250 are both equal to the value $R_{OP}$. Assuming that $V_O$ is greater than $V_I$, an error current, $I_{ERR}$, flowing through the first resistance 244 from the output of the single-ended amplifier 242 to the first terminal of the variable resistance 236 is equal to $(V_O-V_I)/R_F$. The voltage at the output of the op-amp 248 is equal to $2V_I-V_O$. The current flowing through the fourth resistance 252 between the output of the op-amp 248 and the first terminal of the variable resistance 236 is then equal to $(V_I-V_O)/R_F$. This is the opposite of $I_{ERR}$, so that the currents through the first and fourth resistances 244 and 252 cancel at the first terminal of the variable resistance 236. Therefore, the bias current flowing through the variable resistance 236 will be established only by the first current source 232.

If $V_O$ is less than $V_I$, the current $(V_O-V_I)/R_F$ is negative, meaning that $I_{ERR}$ physically flows from the first terminal of the variable resistance 236 to the output of the single-ended amplifier 242. The current flowing through the fourth resistance 252, $(V_I-V_O)/R_F$, is then positive and thus still cancels $I_{ERR}$ at the first terminal of the variable resistance 236.

Figure 5:
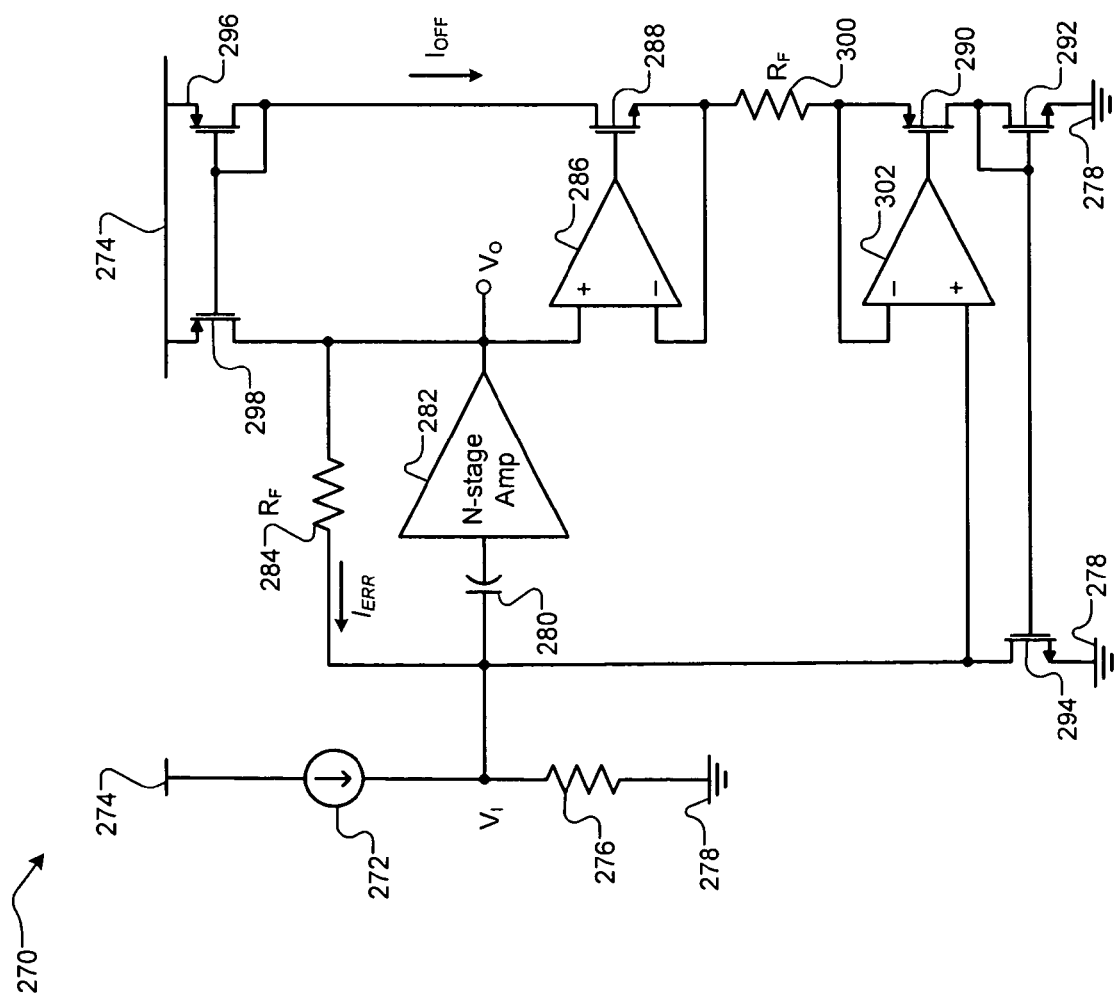
FIG. 5 is an electrical schematic of an exemplary amplifier including feedback error current cancellation at both terminals of the amplifier.

Referring now to FIG. 5, an electrical schematic of an exemplary amplifier 270 including feedback error current cancellation at both terminals of the amplifier is portrayed. A first current source 272 communicates with a supply potential 274. The first current source 272 also communicates with a first terminal of a variable resistance 276. An opposite terminal of the variable resistance 276 communicates with a ground potential 278. The first terminal of the variable resistance 276 communicates with a first terminal of a first capacitance 280. A second terminal of the first capacitance 280 communicates with an input of a single-ended amplifier 282. Skilled artisans will recognize that the single-ended amplifier 282 may include multiple stages. An output of the single-ended amplifier 282 communicates with a first terminal of a first resistance 284. An opposite terminal of the first resistance 284 communicates with the first terminal of the first capacitance 280. The output of the single-ended amplifier 282 communicates with a noninverting input of a first op-amp 286.

This circuit includes first, second, third, fourth, fifth, and sixth transistors 288, 290, 292, 294, 296, and 298, respectively. In this implementation the first, second, third, fourth, fifth, and sixth transistors 288, 290, 292, 294, 296, and 298 are metal-oxide semiconductor field-effect transistors (MOSFETs) that have gates, sources, and drains, although other transistor types may be used. An inverting input of the first op-amp 286 communicates with a source (or second terminal) of the first transistor 288. An output of the first op-amp 286 communicates with a gate (or control terminal) of the first transistor 288. The source of the first transistor 288 communicates with a first terminal of a second resistance 300. An opposite terminal of the second resistance communicates with an inverting input of a second op-amp 302. The opposite terminal of the second resistance 300 also communicates with a source of the second transistor 290. A gate of the second transistor 290 communicates with an output of the second op-amp 302. A drain (or first terminal) of the second transistor 290 communicates with a drain of the third transistor 292.

The drain of the third transistor 292 communicates with a gate of the third transistor 292. A source of the third transistor 292 communicates with the ground potential 278.

The gate of the third transistor 292 communicates with a gate of the fourth transistor 294. A source of the fourth transistor 294 communicates with the ground potential 278. A drain of the fourth transistor 294 communicates with a noninverting input of the second op-amp 302. The drain of the fourth transistor 294 also communicates with the first terminal of the variable resistance 276. A drain of the first transistor 288 communicates with a drain of the fifth transistor 296. The drain of the fifth transistor 296 communicates with a gate of the fifth transistor 296. The gate of the fifth transistor 296 communicates with a gate of the sixth transistor 298. A drain of the sixth transistor 298 communicates with the output of the single-ended amplifier 282. A source of the fifth transistor 296 and a source of the sixth transistor 298 both communicate with the supply potential 274.

The voltage at the output of the single-ended amplifier 282 is referred to as $V_O$. The voltage at the first terminal of the variable resistance 276 is referred to as $V_I$. The first resistance 284 and the second resistance 300 are both equal to the value $R_F$. The voltage at the first terminal of the second resistance 300 will be equal to $V_O$. The voltage at the opposite terminal of the second resistance 300 will be equal to $V_O$. The current through the second resistance 300 will then be equal to $(V_O-V_I)/R_F$. This current, referred to as $I_{OFF}$, also passes through the fifth and the third transistors 296 and 292. The fifth and the sixth transistors 296 and 298 form current mirror so that $I_{OFF}$ also passes through the sixth transistor 298.

The current flowing through the first resistance 284, $I_{ERR}$, is equal to $(V_O-V_I)/R_F$. $I_{ERR}$ and $I_{OFF}$ are thus equal, so that the current flowing through the first resistance 284 is drawn solely from the drain of the sixth transistor 298 and not from the output of the single-ended amplifier 282. The amount of current drawn by the feedback resistor 284 can be significant, and $I_{OFF}$ prevents that feedback current from altering the performance of the single-ended amplifier 282. The third and fourth transistors 292 and 294 also form current mirror, causing $I_{OFF}$ to flow through the fourth transistor 294. The current $I_{ERR}$, being equal to $I_{OFF}$, will flow directly from the opposite terminal of the first resistance 284 to the drain of the fourth transistor 294 and will not pass through the variable resistance 276. Therefore, the bias current through the variable resistance 276 remains at the level set by the first current source 272.

FIG. 5 depicts a situation where $V_O$ is greater than $V_I$. Generally, the circuit designer will know whether $V_O$ will be greater than or less than $V_I$. Skilled artisans will recognize that for FIG. 5 to be adapted to a situation where $V_O$ is less than $V_I$, connections at the input and output of the single-ended amplifier 282 may be reversed. That is, the drain of the fourth transistor 294 and the noninverting input of the second op-amp 302 will communicate with the output of the single-ended amplifier 282, while the drain of the sixth transistor 298 and the noninverting input of the first op-amp 286 will communicate with the first terminal of the first capacitance 280.

Skilled artisans will also recognize that the resistance value of the second resistance 300 can be scaled with respect to the resistance value of the first resistance 284. In this case, third and fourth transistors 292 and 294 may be scaled appropriately, as well as fifth and sixth transistors 296 and 298.

Figure 6:
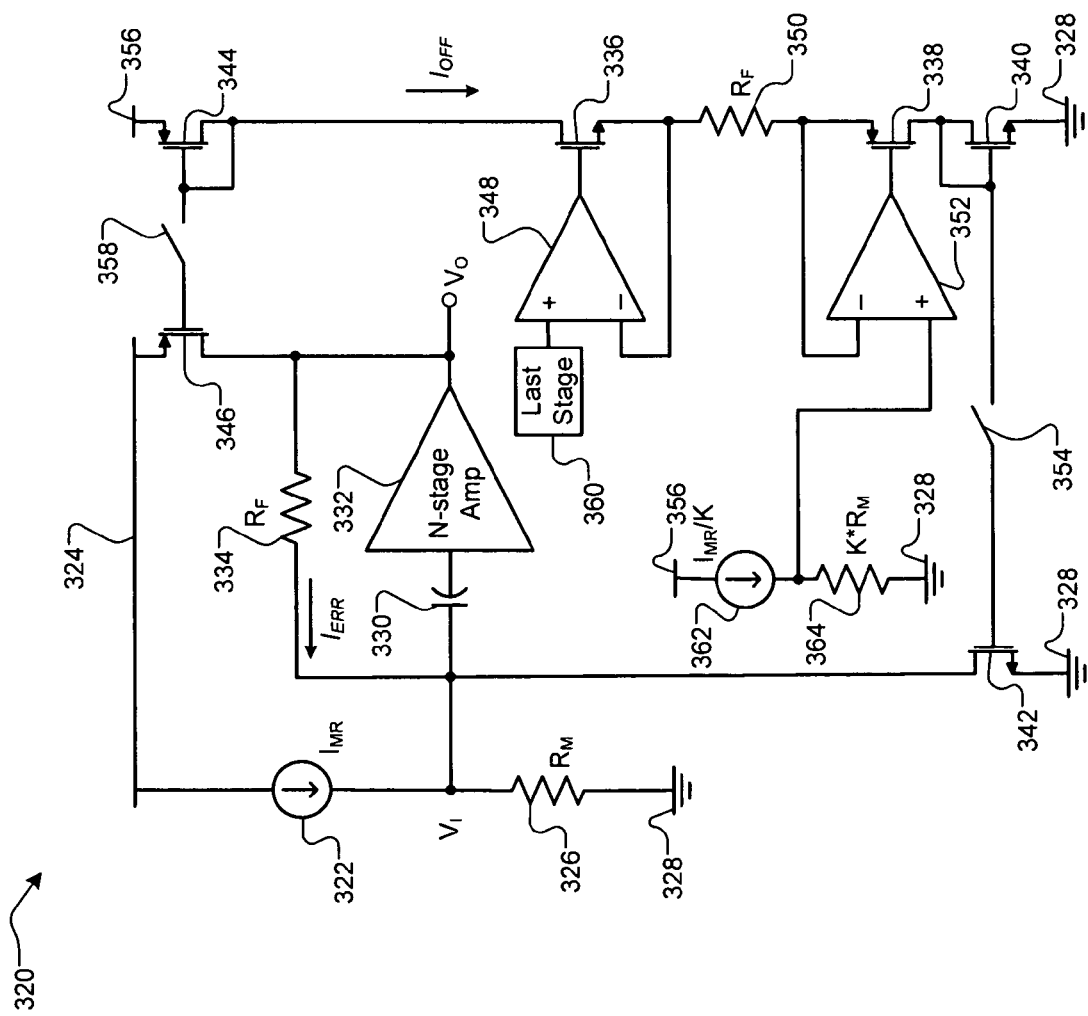
FIG. 6 is an electrical schematic of an exemplary amplifier including feedback error current cancellation at both terminals of the amplifier and replica biasing.

Referring now to FIG. 6, an electrical schematic of an exemplary amplifier 320 including feedback error current cancellation at both terminals of the amplifier and replica biasing for fast recovery is portrayed. A first current source 322 communicates with a first supply potential 324. The first current source 322 also communicates with a first terminal of a variable resistance 326. An opposite terminal of the variable resistance 326 communicates with a ground potential 328. The first terminal of the variable resistance 326 communicates with a first terminal of a first capacitance 330. A second terminal of the first capacitance 330 communicates with an input of a single-ended amplifier 332. Skilled artisans will recognize that the single-ended amplifier 332 may include multiple stages. An output of the single-ended amplifier 332 communicates with a first terminal of a first resistance 334. An opposite terminal of the first resistance 334 communicates with the first terminal of the first capacitance 330.

This circuit includes first, second, third, fourth, fifth, and sixth transistors 336, 338, 340, 342, 344, and 346, respectively. In this implementation, the first, second, third, fourth, fifth, and sixth transistors 336, 338, 340, 342, 344, and 346 are metal-oxide semiconductor field-effect transistors (MOSFETs) that have gates, sources, and drains, although other transistor types may be used. An inverting input of a first op-amp 348 communicates with a source (or second terminal) of the first transistor 336. An output of the first op-amp 348 communicates with a gate (or control terminal) of the first transistor 336. The source of the first transistor 336 communicates with a first terminal of a second resistance 350. An opposite terminal of the second resistance 350 communicates with an inverting input of a second op-amp 352. The opposite terminal of the second resistance 350 also communicates with a source of the second transistor 338. A gate of the second transistor 338 communicates with an output of the second op-amp 352. A drain (or first terminal) of the second transistor 338 communicates with a drain of the third transistor 340. The drain of the third transistor 340 communicates with a gate of the third transistor 340. A source of the third transistor 340 communicates with the ground potential 328. The gate of the third transistor 340 communicates with a first terminal of a first switch 354.

A second terminal of the first switch 354 communicates with a gate of the fourth transistor 342. A source of the fourth transistor 342 communicates with the ground potential 328. A drain of the fourth transistor 342 communicates with the first terminal of the variable resistance 326. A drain of the first transistor 336 communicates with a drain of the fifth transistor 344. The drain of the fifth transistor 344 communicates with a gate of the fifth transistor 344. A source of the fifth transistor communicates with a second supply potential 356. The gate of the fifth transistor 344 communicates with a first terminal of a second switch 358. A second terminal of the second switch 358 communicates with a gate of the sixth transistor 346. A drain of the sixth transistor 346 communicates with the output of the single-ended amplifier 332. A source of the sixth transistor 346 communicates with the first supply potential 324.

A scaled-down replica 360 of the last stage of the single-ended amplifier 332 communicates with a noninverting input of the first op-amp 348. The replica 360 requires less current, and thus less power, than the last stage of the single-ended amplifier 332, but has the same DC operating characteristics. In other words, the replica 360 will output the same DC voltage that the single-ended amplifier 332 does.

A second current source 362 communicates with the second supply potential 356. The second current source 362 communicates with a first terminal of a third resistance 364. An opposite terminal of the third resistance 364 communicates with the ground potential 328. The first terminal of the third resistance 364 communicates with a noninverting input of the second op-amp 352.

The voltage at the output of the single-ended amplifier 332 is referred to as $V_O$. The voltage at the first terminal of the variable resistance 326 is referred to as $V_I$. The first resistance 334 and the second resistance 350 are both equal to the value $R_F$. The current provided by the second current source 362 is equal to the current provided by the first current source 322 divided by a constant K. The value of the third resistance 364 is equal to the nominal value of the variable resistance 326 multiplied by the constant K. The voltage at the first terminal of the third resistance 364 will be equal to the nominal value of $V_I$ because the second current source 362 and the third resistance 364 are scaled in opposite directions by the same factor K. The voltage at the noninverting input of the first op-amp 348 will be equal to the nominal value of $V_O$ because the DC value at the output of the single-ended amplifier 332 will be the same as that of its scaled-down last stage. The voltage at the first terminal of the second resistance 350 will then be equal to $V_o$. The voltage at the opposite terminal of the second resistance 350 will then be equal to $V_I$. The current through the second resistance 350 will then be equal to $(V_O-V_I)/R_F$. This current, referred to as $I_{OFF}$, also passes through the fifth and third transistors 344 and 340.

In normal operation, the fifth and sixth transistors 344 and 346 form current mirror so that $I_{OFF}$ also passes through the sixth transistor 346. The current flowing through the first resistance 334, $I_{ERR}$, is equal to $(V_O-V_I)/R_F$. $I_{ERR}$ and $I_{OFF}$ are thus equal, so that the current through the first resistance 334 is drawn solely from the drain of the sixth transistor 346 and not from the output of the single-ended amplifier 332. This prevents feedback current from altering the performance of the single-ended amplifier 332. The third and fourth transistors 340 and 342 also form current mirror, causing $I_{OFF}$ to flow through the fourth transistor 342. The current $I_{ERR}$, being equal to $I_{OFF}$, will flow directly from the opposite terminal of the first resistance 334 to the drain of the fourth transistor 342 and will not pass through the variable resistance 326. Therefore, the bias current through the variable resistance 326 remains at the level set by the first current source 322.

The second supply potential 356 is energized so long as the amplifier is powered on. During normal operation, the first and second switches 354 and 358 are both in a closed, or conducting, position. Additionally, the first supply potential 324 is on, i.e. at the same potential as the second supply potential 356. If the amplifier is to be put into a sleep, or low power, mode, the first and second potentials could both be turned off. However, when they would be turned back on, the circuit would take a significant amount of time to recover, or stabilize. The current implementation causes only the first supply potential 324 to be powered off in order to put the circuit into sleep mode. When the first supply potential 324 is turned off, the first and second switches 354 and 358 are opened to disconnect the current mirrors from the single-ended amplifier 332. The second current source 362 and last stage replica 360 are scaled to consume less power. The replicated voltages at the inputs to the first and second op-amps 348 and 352 allow the current $I_{OFF}$ to be maintained when the first supply potential 324 is off. When the first supply potential 324 is turned on, the current $I_{OFF}$ is ready to allow the amplifier to recover from sleep mode quickly.

FIG. 6 depicts a situation where $V_O$ is greater than $V_I$. Generally, the circuit designer will know whether $V_O$ will be greater than or less than $V_f$. Skilled artisans will recognize that for FIG. 6 to be adapted to a situation where $V_O$ is less than $V_f$, input and output connections may be reversed. That is, the noninverting input of the first op-amp 348 communicates with the first terminal of the third resistance 364, the noninverting input of the second op-amp 352 communicates with the replica 360, the drain of the sixth transistor 346 communicates with the first terminal of the first capacitance 330, and the drain of the fourth transistor 342 communicates with the output of the single-ended amplifier 332.

Skilled artisans will also recognize that the resistance value of the second resistance 350 can be scaled with respect to the resistance value of the first resistance 334. In this case, third and fourth transistors 340 and 342 may be scaled appropriately, as well as fifth and sixth transistors 344 and 346.

Figure 7:
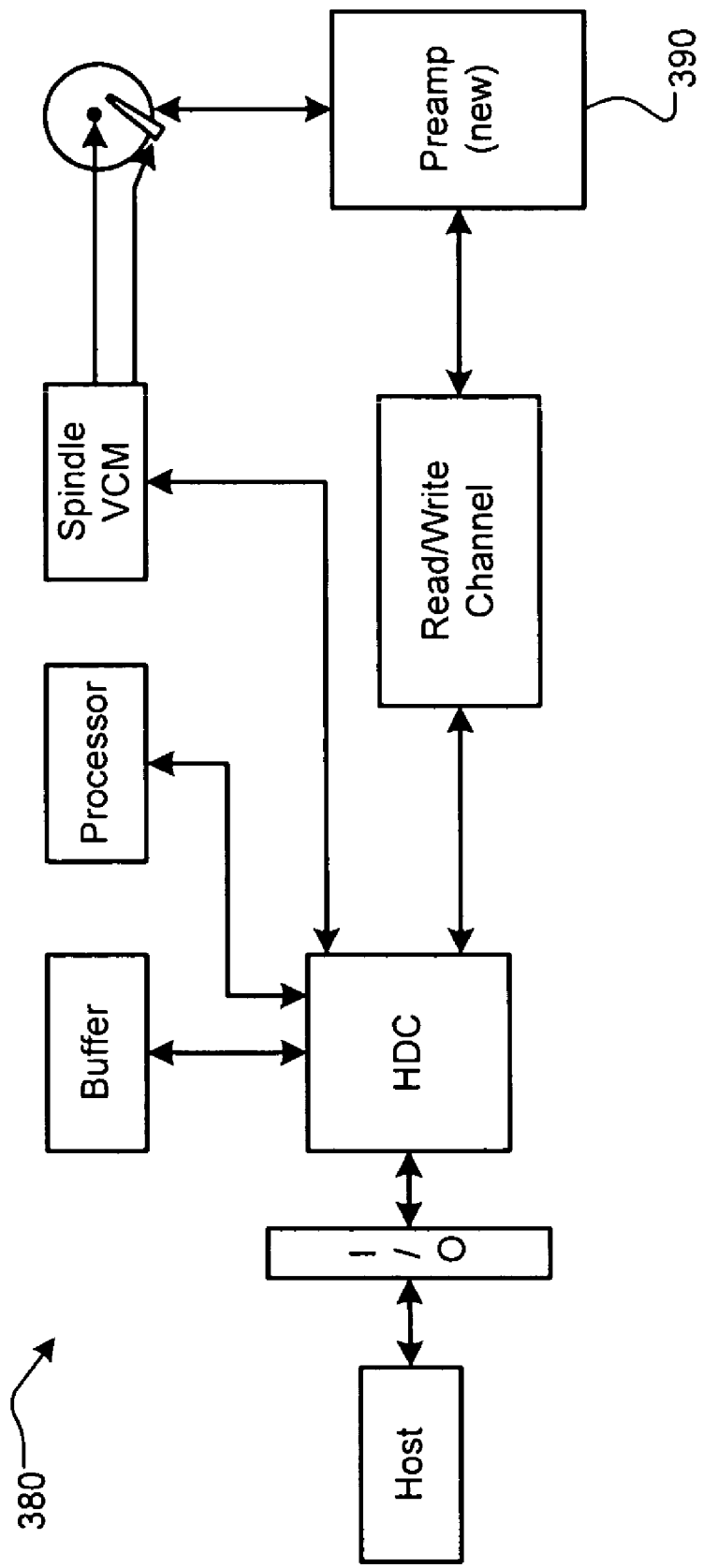
FIG. 7 is a hard drive employing a preamplifier according to the principles of the present invention.

Referring now to FIG. 7, a hard disk drive environment 380 similar to that of FIG. 1 is presented, with the preamplifier 124 being replaced by a new preamplifier 390 according to the principles of the present invention. The new preamplifier 390 is not susceptible to feedback error currents and yet does not have a complex frequency response that makes its design difficult. Further, addition of feedback current compensation does not necessarily increase the time the new preamplifier 390 takes to recover from sleep mode.

Figure 8:
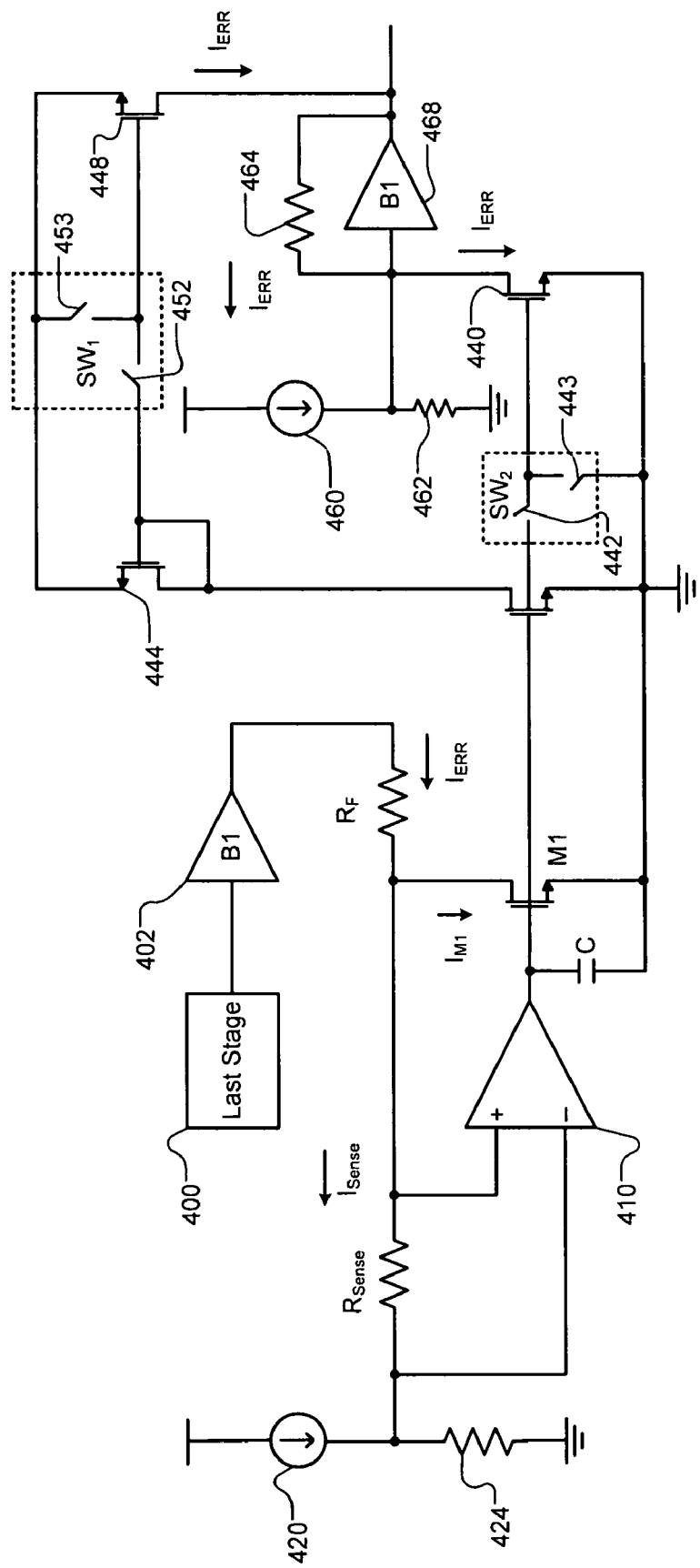
FIG. 8 is an electrical schematic of an exemplary amplifier employing an alternate feedback current compensation device.

Referring now to FIG. 8, another circuit configuration that employs replica biasing is shown. A last stage 400 communicates with a buffer 402, which has an output that communicates with one end of a resistance $R_F$. An opposite end of the resistance $R_F$ communicates with a non-inverting input of an opamp 410, one end of a sense resistance $R_{Sense}$ and a first terminal of a transistor M1. An opposite end of the sense resistance $R_{Sense}$ communicates with current source 420 and one end of a resistance 424. A sense current $I_{Sense}$ flows across the sense resistance $R_{Sense}$ to generate a sense voltage across the inputs of the opamp 410. An output of the opamp 410 communicates with a capacitance C and with control inputs of the transistor M1, a transistor 430 and a transistor 440 (through switch block $SW_2$). The switch block $SW_2$ includes a first switch 442 that connects the control terminals of the transistors 430 and 440 and a second switch 443 that shorts the control terminals.

A first terminal of transistor 430 communicates with a first terminal and a control terminal of a transistor 444. The control terminal of transistor 444 communicates with a control terminal of a transistor 448 via switch block $SW_1$. The switch block $SW_1$ includes a first switch 452 that connects the control terminals of the transistors 444 and 448 and a second switch 443 that connects the control terminals to second input terminals thereof.

A first terminal of transistor 440 communicates with current source 460, a resistance 462, one end of resistance 464 and an input of buffer 468. An output of the buffer 468 communicates with an opposite end of the resistance 464 and with the first terminal of the transistor 448. As can be seen in FIG. 8, the error current $I_{ERR}$ flows as shown. The circuit in FIG. 8 operates in a manner that is similar to the operation of the circuit in FIG. 6, which also uses replica biasing. Buffer 402 prevents loading at a last stage replica circuit. When $I_{Sense} \approx 0$, $I_{ERR} = I_{M1}$. This condition will provide proper compensation. The switch blocks $SW_1$ and $SW_2$ are used for isolation during power down.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. An amplifier system with feedback current cancellation comprising:
    an amplifier with an input, an output, and at least one stage;
    a feedback network that includes a first resistance having one end that communicates with the input of the amplifier and an opposite end that communicates with the output of the amplifier;
    first and second unity-gain buffers, each having an input and an output,
    wherein the input of the first buffer communicates with the output of the amplifier, and the input of the second buffer communicates with the input of the amplifier;
    a second resistance that has one end that communicates with the output of the first buffer, and an opposite end that communicates with the output of the second buffer; and
    a first current mirror that provides a first current at the input of the amplifier that is proportional to a second current flowing through the second resistance.

2. The amplifier system of claim 1 wherein the second resistance has a resistance value that is approximately equal to a resistance value of the first resistance, and wherein the first current is approximately equal to the second current.

3. A sensor system comprising the amplifier system of claim 1 and further comprising:
    a first current source; and
    a variable resistance that communicates with, and is biased by, the first current source, wherein the input of the amplifier communicates with one end of the variable resistance.

4. A hard disk drive system comprising the sensor system of claim 3.

5. The amplifier system of claim 1 further comprising a second current mirror that provides a third current at the output of the amplifier that is approximately equal to the first current.

6. A sensor system comprising the amplifier system of claim 5 and further comprising:
    a first current source; and
    a variable resistance that communicates with, and is biased by, the first current source, wherein the input of the amplifier communicates with one end of the variable resistance.

7. A hard disk drive system comprising the sensor system of claim 6.

8. The amplifier system of claim 1 wherein the amplifier is arranged in a differential mode.

9. The amplifier system of claim 1 wherein the amplifier is arranged in a single-ended mode.

10. The amplifier system of claim 1 further comprising a DC blocking capacitance that communicates with the input of the amplifier.

11. An amplifying system with feedback current cancellation comprising:
    amplifying means for amplifying an input and including an output and at least one stage;
    feedback means for providing feedback and that includes first resistance means for providing resistance and that includes one end that communicates with the input of the amplifying means and an opposite end that communicates with the output of the amplifying means;

first and second buffering means for buffering, each having an input and an output, wherein the input of the first buffering means communicates with the output of the amplifying means, and the input of the second buffering means communicates with the input of the amplifying means;

second resistance means for providing resistance and that includes one end that communicates with the output of the first buffering means, and an opposite end that communicates with the output of the second buffering means; and first current means for providing a first current at the input of the amplifying means that is proportional to a second current flowing through the second resistance means.

12. The amplifying system of claim 11 wherein the second resistance means has a resistance value that is approximately equal to a resistance value of the first resistance means, and wherein the first current is approximately equal to the second current.

13. A sensing system comprising the amplifying system of claim 11 and further comprising:

second current means for providing current; and variable resistance means for providing a variable resistance that communicates with, and is biased by, the second current means, wherein the input of the amplifying means communicates with one end of the variable resistance means.

14. A hard disk drive system comprising the sensing system of claim 13.

15. The amplifying system of claim 11 further comprising second current means for providing a third current at the output of the amplifying means that is approximately equal to the first current.

16. A sensing system comprising the amplifying system of claim 15 and further comprising:

second current means for providing current; and variable resistance means for providing a variable resistance that communicates with, and is biased by, the second current means, wherein the input of the amplifying means communicates with one end of the variable resistance means.

17. A hard disk drive system comprising the sensing system of claim 16.

18. The amplifying system of claim 11 wherein the amplifying means is arranged in a differential mode.

19. The amplifying system of claim 11 wherein the amplifying means is arranged in a single-ended mode.

20. The amplifying system of claim 11 further comprising DC blocking means for blocking DC signals and that communicates with the input of the amplifying means.

* * * * *

UNITED STATES PATENT AND TRADEMARK OFFICE
CERTIFICATE OF CORRECTION

| | |
|---|---|
| PATENT NO. | : 7,359,136 B1 |
| APPLICATION NO. | : 11/652184 |
| DATED | : April 15, 2008 |
| INVENTOR(S) | : Thart Fah Voo |

It is certified that error appears in the above-identified patent and that said Letters Patent is hereby corrected as shown below:

Column 6, Line 24      Delete "$V_o$" and insert -- $V_I$ --

Signed and Sealed this

Ninth Day of September, 2008

JON W. DUDAS
*Director of the United States Patent and Trademark Office*